United States Patent [19]
Devin

[11] Patent Number: 5,870,336
[45] Date of Patent: Feb. 9, 1999

[54] MEMORY WITH IMPROVED READING TIME

[75] Inventor: Jean Devin, Allée des Cigales, France

[73] Assignee: SGS-Thomson Microelectronics S.A., Saint Genis, France

[21] Appl. No.: 957,666

[22] Filed: Oct. 24, 1997

[30] Foreign Application Priority Data

Oct. 25, 1996 [FR] France .................................. 96 13080

[51] Int. Cl.⁶ .................................................. G11C 16/06
[52] U.S. Cl. ................................ 365/185.2; 365/185.21; 365/210
[58] Field of Search ........................... 365/185.21, 185.2, 365/210, 203, 205, 207, 208, 195, 196

[56] References Cited

U.S. PATENT DOCUMENTS

| | | | |
|---|---|---|---|
| 5,029,135 | 7/1991 | Okubo | 365/203 |
| 5,091,888 | 2/1992 | Akaogi | 365/185.2 |
| 5,537,349 | 7/1996 | Devin | 365/185.33 |
| 5,563,826 | 10/1996 | Pascucci et al. | 365/185.21 |
| 5,650,966 | 7/1997 | Cleveland et al. | 365/185.2 |
| 5,757,697 | 5/1998 | Briner | 365/185.21 |

FOREIGN PATENT DOCUMENTS

| | | | |
|---|---|---|---|
| 0 145 488 | 6/1985 | European Pat. Off. | G11C 11/24 |
| 0 422 939 | 4/1991 | European Pat. Off. | G11C 7/00 |
| 0 526 433 | 2/1993 | European Pat. Off. | G11C 7/00 |
| 0 660 333 | 6/1995 | European Pat. Off. | G11C 16/06 |

OTHER PUBLICATIONS

French Search Report from French application No. 96/13080, filed Oct. 15, 1997.

Patent abstract from Japan vol. 018, No. 519 & JP 06 176583, invented by Shigeru, pub. date Apr. 24, 1994.

*Primary Examiner*—Son Mai
*Attorney, Agent, or Firm*—Wolf, Greenfield & Sacks, P.C.

[57] ABSTRACT

To improve the reading time of a memory, it is determined when a word line will be completely charged by making an additional memory cell, connected to an additional bit line, at the end of this word line. The additional memory cells are all in a programming state such that they enable the detection of a read current positively. Furthermore, by programming these cells insufficiently, they become conductive before the normal cells of the memory array. This instant is used to activate the reading of the cells of the memory array.

19 Claims, 3 Drawing Sheets

MEMORY WITH IMPROVED READING TIME

BACKGROUND OF THE INVENTION

1. Field of the Invention

The invention relates to a memory having fast reading time. More particularly, the invention relates to non-volatile memories comprising floating gate transistors, having a reading time smaller than 100 nanoseconds.

2. Discussion of the Related Art

Nonvolatile memories having floating-gate transistors are of the so-called EPROM or EEPROM or even FLASH-EPROM type depending on the mode of programming and the mode of erasure chosen for the memory cells. An example of this type of memory is described for example in the patent application FR-A-2 714 202. The usual elementary reading time of a bit or word in a memory of this kind is about 100 nanoseconds.

The principle of the reading of the memory cells comprising a floating-gate transistor is as follows. In the floating gate of the transistor, charges are either stored or not, depending on whether the transistor is said to be programmed or erased (or vice versa, as the designations used differ from one technology to another). In one example, the charges stored are electrons. The floating gate then acts as a potential generator. When a cell is to be read, the drain and source regions of this transistor are subjected to a sufficient potential difference and a voltage capable of making the control gate of the floating-gate transistor conductive is applied to it. If there are no electrical charges stored on the floating-gate, the transistor becomes conductive. If there are electrical charges stored on the floating gate, the voltage applied to the control gate is insufficient to combat the potential induced by the floating gate and thus the transistor does not conduct. A read circuit, in principle, has a device that measures the presence or absence of conduction current through the transistor. The detection or non-detection of this passage of current provides information on the binary state memorized in the memory cell.

FIG. 1 provides a schematic view of a memory cell of this kind with a floating-gate transistor. This transistor has a source 1 connected to a ground and a drain 2 connected to a bit line LB 3. Bit line 3 is connected to a current measurement circuit (not shown) which, in practice, is a voltage generator with high internal impedance. As soon as the generator lets through current, the voltage on bit line 3 drops. The transistor of the memory cell furthermore has a floating gate 4 and a control gate 5 superimposed on the floating gate 4 and playing the role of a word line LM. The memory array of a memory has several cells of this type connected in matrix form to the bit lines and to the word lines.

As a general rule, the bit line is formed, at the top of the integrated circuit, by a metallized line: it has very low resistivity. Consequently, the propagation of the read voltage on a bit line is very swift. By contrast, the word line 5 consists of a polysilicon layer: it is resistive. Even if the word line has metallized sections, the word line still consists of polysilicon sections such that word line 5 remains more resistant than the bit line 3. In view of the surfaces presented by these conduction lines with respect to the memory array, these lines are capacitive. Since the word line is more resistive than the bit line, it is slower in allowing the necessary read voltage to build up.

At the time of reading, the build-up of the different potentials on the lines must be synchronized allowing the word line sufficient time to build up voltage on the gate. For example, at the detection of an address transition signal, when a new word or a new cell of the memory is addressed to be read, there is no point in immediately preparing the read circuit connected to the bit line (this is a preparation that lasts about 10 nanoseconds) if in the meantime the word line takes about 80 nanoseconds to get charged.

FIG. 2 furthermore shows the behavior of a floating-gate transistor of a memory cell whose word line receives a potential VLM that increases slowly (taking every factor into consideration) starting from an instant t0 corresponding to a detection of an address transition. In one example where the conduction threshold VT of a floating-gate transistor is about 2 to 3 volts and where the electrical supply of the integrated circuit is about 5 volts, a value of 4 volts (80% of the electrical supply) is chosen as being the value necessarily applied to the control gate 4 to make the transistor conductive. For example, FIG. 2 shows that when the applied voltage is equal to VT, the conduction current I of the transistor begins to increase. It reaches a significant value which allows reading of the transistor only when the voltage on the word line is equal to approximately 4 volts (80% of the electrical supply). It is important to have precise knowledge of the time t at which, for a given integrated circuit, this reading will be possible.

Unfortunately, the time t greatly depends on the design of the different transistors, the chronology of the steps of the method leading to the manufacture of the integrated circuit, as well as the conditions of use of this circuit, especially the value of the supply voltage and the temperature of use. For example, it is known that the value of t varies greatly, for example between 50 nanoseconds for a naturally fast circuit and 100 nanoseconds for a slow circuit. The reasons for the speed variations can be understood from FIG. 2. When the cell becomes conductive, the current I increases suddenly and the slope of growth of the voltage on the word line is small. Consequently, a very small disturbance in the polarization of these word lines or in the operating conditions of the floating-gate transistors is sufficient to result in great variations in the activation instant t, i.e., the time VT is reached indicated in the figure by means of dashes.

In the prior art, to overcome this problem, and to obtain the value of t, the voltage build-up time of the word lines is simulated on an additional word line or false word line. In practice, the false word line has been simulated by a single RC type circuit. However, in order to have time constants that are independent of temperature and supply voltage and of the method of manufacture of the integrated circuit, it has become necessary to make BANDGAP type circuits or circuits with bipolar transistors. Apart from their complexity, these circuits have the drawback of consuming current continuously if speed is to be obtained. All the same, it is necessary to take account of worse-case situations with these circuits, namely cases where the period is 100 nanoseconds.

Another problem also arises. Indeed, it is possible that the address bus connected to the memory will be badly managed and deliver false addresses in an anarchic manner even for a certain period. These false addresses are detected by the address transition detection circuit and normally prompt a build-up in voltage of the false word line which will be used to prepare the activation time t, the instant of synchronization of the reading. When the detection is a parasitic address transition detection, it is necessary, at a subsequent address transition detection, to swiftly discharge the false word line from the voltage to which it has risen and then begin charging it again towards its nominal voltage.

There are approaches in which the false word line of the RC type is provided with several capacitors distributed along the line and, to discharge it, with several big deselection transistors parallel-connected with these transistors. They make it possible to reposition the false word line at zero before making the voltage rise again. In one example, there are known word lines with 1000 cells in which it is necessary to have eight big transistors separating groups of 128 cells. However, the distribution of these eight big transistors modifies the rules of design: the pattern of the cells is no longer repetitive (it has to be modified every 128 cells) and the making of the integrated circuit becomes far too complex.

In practice, this is not done. To simplify matters, a simple RC type circuit is made with a single deselection transistor. The problem encountered in this case is that the RC type circuit has characteristics that change greatly with temperature and supply voltage. It is therefore necessary then once again to choose a worst-case situation for this RC type circuit. Ultimately, the memory is made to work in a slowed down manner.

SUMMARY OF THE INVENTION

In the invention, the procedure is different and especially, no simulated word line or additional word line is made. Rather, existing word lines are used. In the invention, at the end of each word line, a memory cell is added. All the memory cells thus added, on a supplementary basis, at the end of each word line are organized into an additional bit line. Also, the additional memory cells of this additional bit line are read before the normal memory cells of a normal memory array. The time of reading the additional memory cells is used as the time for activating the read operation. To ensure their reading prior to the reading of the memory cells, the additional memory cells are designed accordingly, keeping their dependencies on the method of manufacture, the rules of design of the integrated circuit and its conditions of use in the same proportions as the memory cells. Thereof, if the characteristics of the integrated circuit manufactured undergo deterioration, those of the additional bit line undergo similar deterioration proportionally so that the signal available on these additional bit lines can always be used as an activation signal. It is also possible, on the same basis, to modify the circuit for reading the additional bit line to achieve a comparable result.

An object of the invention therefore is a memory comprising: memory cells, each with a floating-gate transistor, connected in matrix form to bit lines and word lines. Also, the memory comprises an address decoding circuit to impose read potentials on at least one bit line and at least one word line corresponding to a cell to be selected and to impose different potentials on the other bit lines and word lines. Also, the memory comprises read circuits, each read circuit being connected to a bit line to measure a current flowing into one of the cells connected to this bit line. Also, the memory comprises an activation circuit to produce a signal to enable the read operation performed by the read circuits. The activation circuit comprises an additional bit line, with additional memory cells controlled by the word lines of the memory. Further, the activation circuit comprises an additional circuit to impose a read potential on this additional bit line at each read operation. Further, the activation circuit comprises the floating-gate transistors of the additional memory cells being in a programming state that prompts the passage of a current through them when their cell is selected. The read circuit of this additional bit line produces the activation signal.

In one example where the memory is an EPROM type memory, a control gate of a floating-gate transistor is connected to a word line, a bit line is connected to a drain or source region of a floating-gate transistor. If the memory is an EEPROM type memory, a control gate of a control transistor of the cell is connected to the word line and the drain or source region of the control transistor or source region of the floating-gate transistor is connected to the bit line. The alternative construction is possible because the position of these two control and floating gate transistors may be reversed.

BRIEF DESCRIPTION OF THE DRAWINGS

The invention will be understood more clearly from the following description and from the appended figures. These figures are given purely by way of an indication and in no way restrict the scope of the invention. Of these figures.

DETAILED DESCRIPTION

Figure 1:
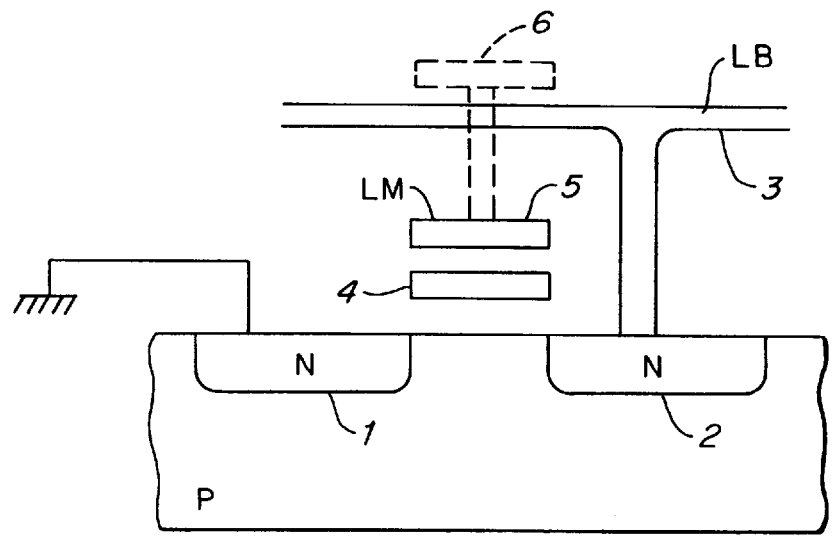
FIGS. 1 and 2 are a drawing and a graph providing schematic views of the working of memory cells with a floating-gate transistor.
Figure 2:
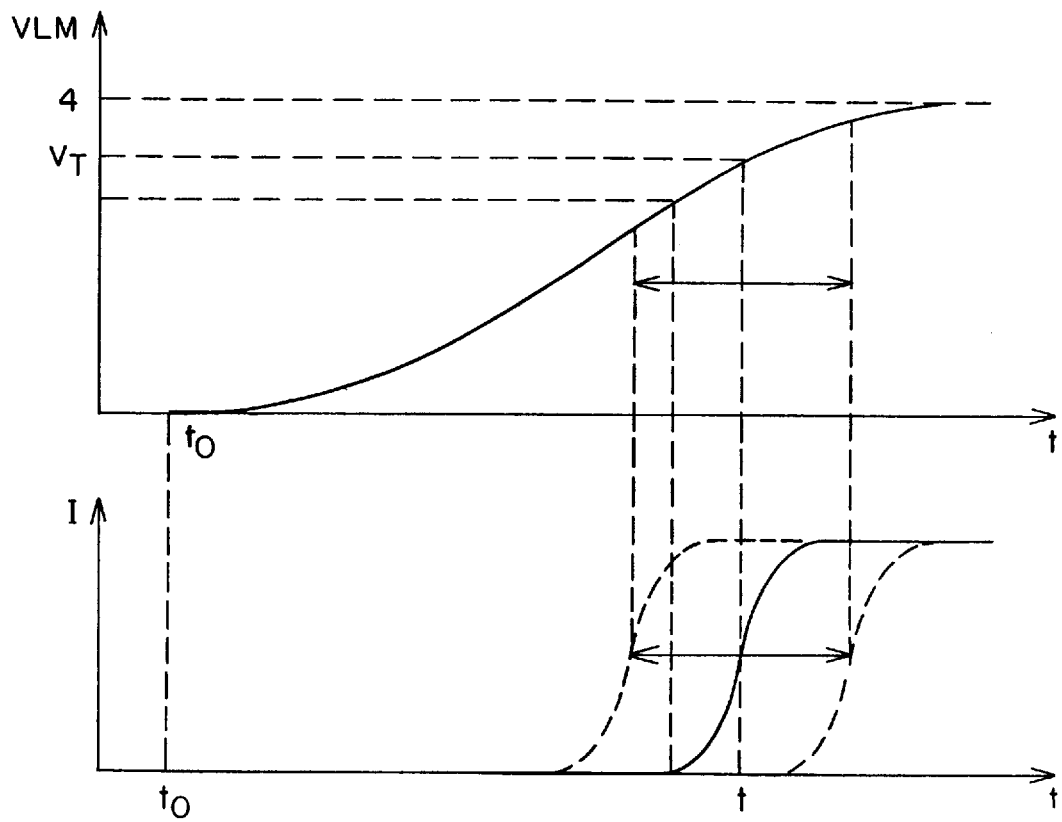
Figure 3:
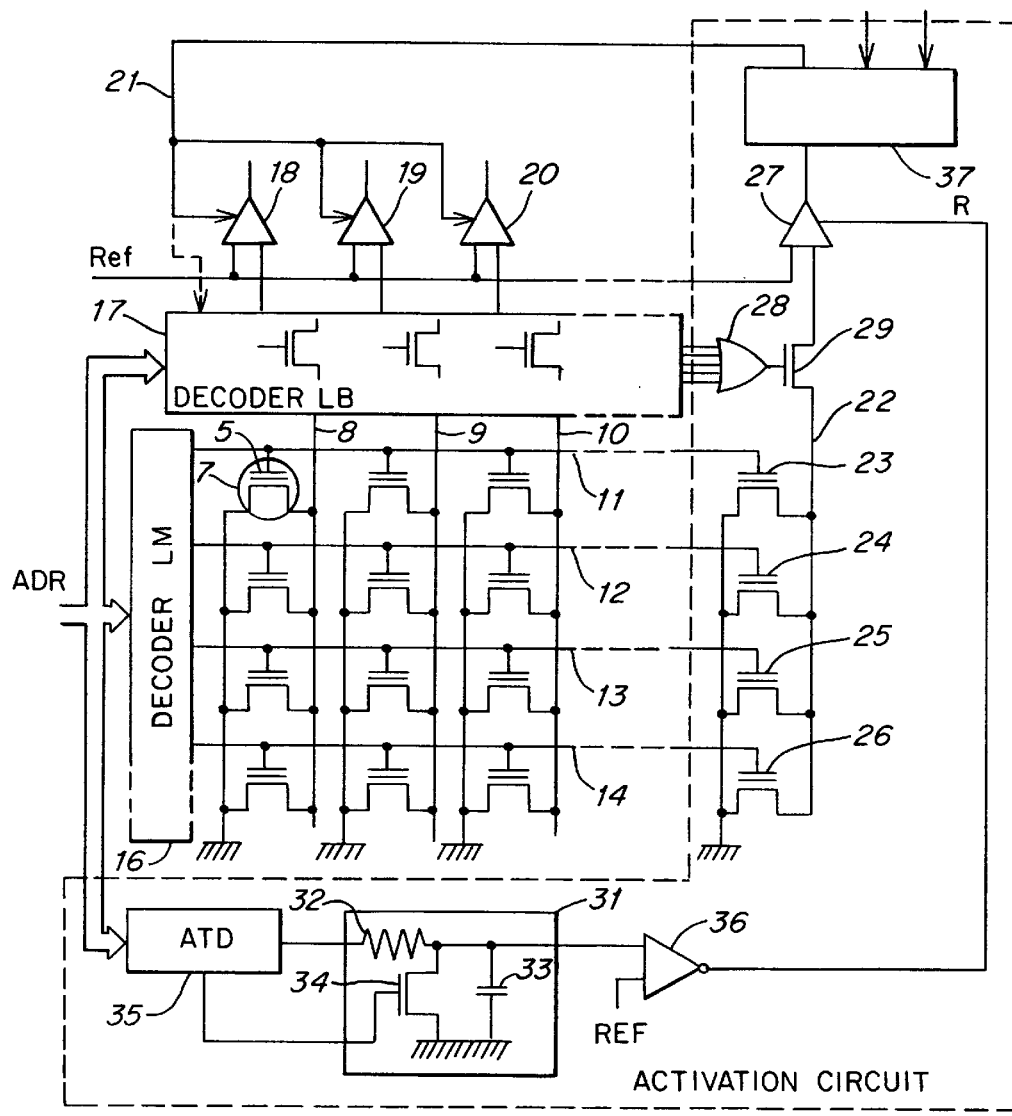
FIG. 3 shows a memory according to the invention.

FIG. 3 gives a view, in the case of an EPROM memory, of a memory provided with memory cells such as 7 each having a floating-gate transistor which is also shown in FIG. 1. These memory cells are connected in matrix form to bit lines such as 8 to 10 and word lines such as 11 to 14. A control gate, for example the control gate 5 of the transistor of the cell 7, is controlled by a word line 11. In the example shown in FIG. 3, the control is direct: the control gate 5 is connected to the word line 11. However, for EEPROM type memory cells comprising a control gate and the floating-gate transistor itself, the control gate of the control transistor is connected to the word line, the source of the control transistor being connected to a drain of the floating-gate transistor and the two transistors being series-connected with each other, in a branch on the bit line. The drain or source region of the transistor of the cell 7 is furthermore connected to a bit line 8. This is a drain or source region depending on the type of technology chosen.

An address decoding circuit 16–17 receives an address signal ADR and uses a word line decoder 16 and a bit line decoder 17 to impose read potentials on at least one bit line and at least one word line corresponding to a cell to be selected. On the other non-selected cells, the decoder dictates other voltages (generally the ground) or, as the case may be, connects the unselected lines to a circuit at very high impedance.

The read voltages may vary, firstly according to the architecture of the memory and secondly according to the technology implemented. In one example, namely the example shown in FIG. 3, the voltage to be imposed on a word line is about VCC (for example 5 volts) and the voltage to be imposed on a bit line is in the same range. The bit line decoder 17 has been shown schematically as having, for each bit line, a transistor series-connected between the concerned bit line and a read circuit. The bit lines 8 to 10 are connected to the cells at one end, and at the other end, the bit lines 8 to 10 are selectively connected to the respective read circuits 18 to 20. Only the bit line that is selected is connected to its read circuit by the placing of the corresponding transistor in a state of conduction.

When these connections are set up, the read circuits 18 to 20 enable the measurement of the current that flows into a selected cell. To this end, the read circuits are generally made in the form of comparator circuits (based on differential amplifiers) measuring the voltage difference between, firstly, a signal Ref available at a reference input and, secondly, a signal available at an input connected to the bit line. In one example, the reference voltage is about half the read voltage (for example 2.5 volts). If the floating-gate transistor of the cell to be read is not conductive, the bit line remains at its read voltage (5 volts) and the comparator is in one given state. On the other hand, if the floating gate transistor to be read is conductive, the bit line gets discharged and the comparator switches over.

The memory also has an activation circuit symbolically represented herein by a control connection 21 that applies a read activation signal to the circuits 18 to 20. Depending on the architecture chosen, the connection 21 may be connected to the decoder 17 to enable its ultimate operation. On the other hand, the connection 21 may be connected to the decoder 17 alone rather than to the read circuits. In one example, with the bit line being pre-charged, the circuit in the read circuits 18–20 or in the decoder 17, which receives the signal conveyed by the connection 21, is an operation enabling circuit. It may take the form of a transistor series-connected in a command transmission line.

According to the invention, an additional bit line 22 is provided which predictably switches to a selected state after a time t1, shortly before reading is possible, triggering the read circuit to read. Thus, using such an additional bit line, as described below, the activation of the read circuit can occur closer to the time at which the memory cell is prepared for reading i.e., reading shortly before the word line voltage has reached a significant value which allows reading. This additional bit line is connected to additional memory cells, in this case 23 to 26. The cells 23 to 26 are controlled by the word lines 11 to 14 in the same way as memory cells of the memory array. A terminal of the floating-gate transistors of these cells is connected to the ground, like a terminal of the floating-gate transistor of the cells of the memory array. The cells 23 to 26 however have the particular feature of being all in a state of programming that prompts the passage of current through them whenever one of them is selected. Thus, regardless of whether the memory cells of the memory array can have two electrical states, the cells 23 to 26 will still have only one of these states, namely the state in which the floating-gate transistor is conductive.

This may be obtained in different ways. For example, the cells 23 to 26 could have no floating-gate transistor: the transistor is a simple transistor. Or else, in manufacture, the blank floating-gate transistors of the additional cells are modified to be naturally conductive. The bit line 22 is connected to a read circuit 27. This read circuit 27 is acted upon at each read operation. This is symbolized by the presence of an OR gate 28 acting on a connection transistor 29 which connects the bit line 22 with the read circuit 27 whenever one of the wires of the address bus has at least an electrical state 1. To simplify the explanation, the read circuit 27 also receives the reference signal Ref at a reference input. The signal delivered by the read circuit 27 is the activation signal needed to validate the read circuits 18 to 20 or even the decoder 17.

Preferably, the transistor of the cells 23 to 26, whether it is a floating-gate transistor or not, will become conductive before a transistor of a normal cell of the memory becomes conductive. At the point that cells 23 to 26 become conductive, the reading circuits can be activated. In order that, in a preferred example, the transistors 23 to 26 become conductive before the normal floating-gate transistors of the memory array, several techniques may be used. In a first technique, the conduction channel of (floating-gate) transistors is implanted with N type impurities in a number sufficient to have a lower threshold voltage. In one variant, the width of transistors 23–26 will be greater than a normal width. The width is the dimension of the channel of the transistor perpendicular to the plane of FIG. 1. In another variant, the coupling between the floating gate 4 and the control gate 5 is modified so that the influence of the voltage imposed on the word line 5 is greater. In practice, in this case, the floating gate and the control gate stretch, in the direction of the width of the transistor, above thick oxide zones that separate the memory cells from each other. In this way, an increase is obtained in the ratio of the inter-gate capacitance to the capacitance between floating gate and conduction channel of the transistor. In a third variant, the transistors 23 to 26, like the transistors of the memory array, have circuits to be programmed or erased and they are programmed, or erased (depending on the technology chosen), at a value smaller than that chosen for the other transistors of the memory array.

Figure 4:
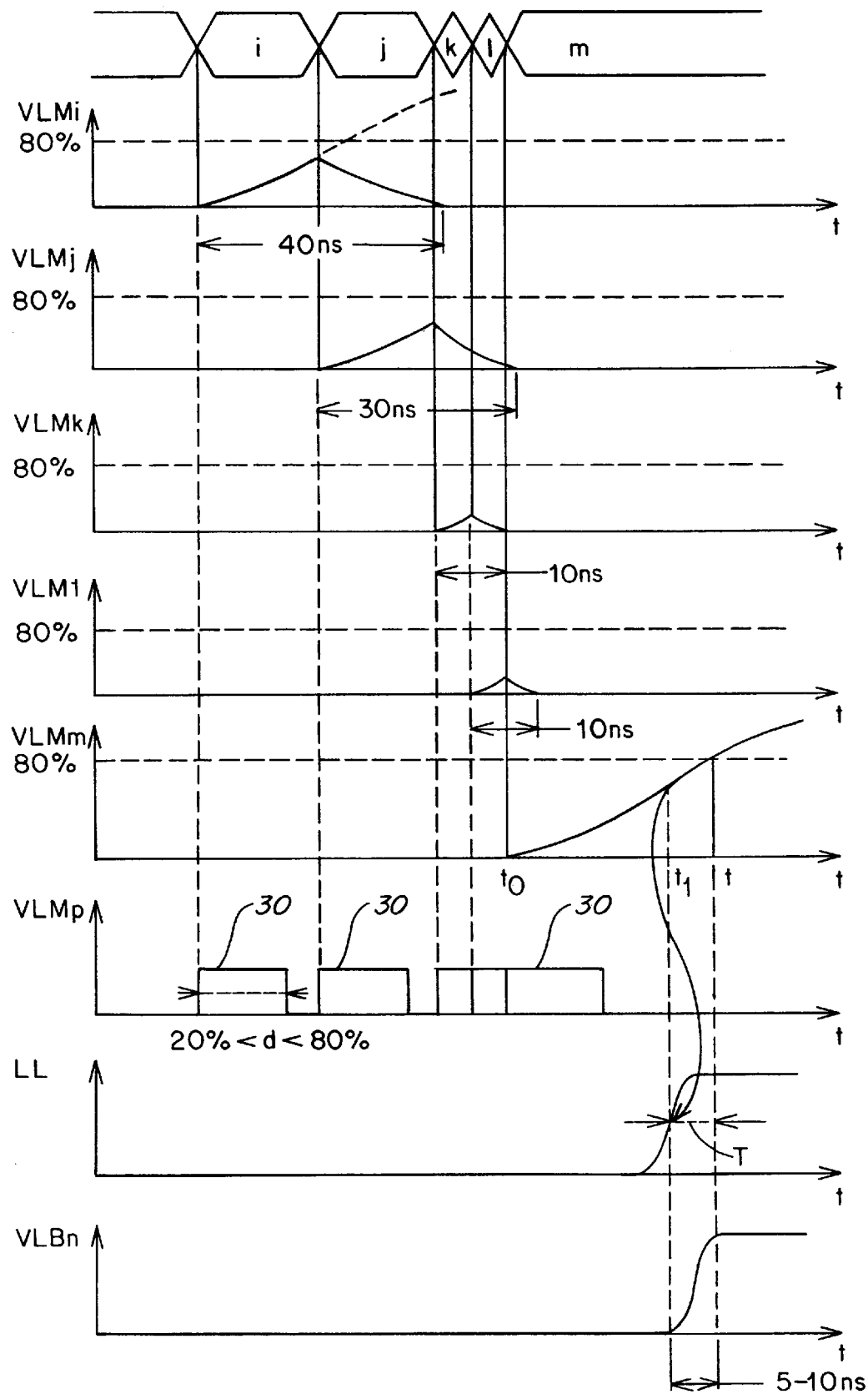
FIG. 4 shows timing diagrams of signals coming into play in the memory of the invention.

FIG. 4 shows a timing diagram of the voltages that appear at the different positions of the memory array of the invention. At the top of the figure, the address signals are present on the address bus to select a word line i and then the words lines j, k, 1 and m. The diagrams located below show the build-up of the voltages on the respective word lines following the addressing of these word lines. In each case, dashes are used to indicate a curve at 80% of the voltage beyond which the normally programmed cells should become conductive.

FIG. 4 shows the cases of erratic operation in (addressing operations of insufficient duration). In graph VLMi, the presence of an address on the word line i is for 40 nanoseconds. In graph VLMj, the presence of an address on the word line j is 30 nanoseconds. In graphs VLMk and VLMl, the respective presence of an address on respective word lines k, l lasts 10 nanoseconds. In no case is the duration of presence of these addresses on the address bus sufficient for the voltage available on each word line i, j, k or l to reach 80% of the necessary voltage. By contrast, for the word line m, the 80% voltage threshold is reached at a time t. According to the invention, one of the cells 23 to 26, located on the same word line as the word line m, becomes conductive at a time t1, prior to time t, due to its lower threshold voltage, for example. Diagram LL shows the difference in time T of conduction between the cell on the additional bit line and the selected cell. This difference T can be controlled by the techniques indicated above: depleted conduction channel, different transistor geometry, different floating gate or level of programming.

One of the particular achievements of the invention is that the duration T between the times t1 and t is independent of the fluctuations of the method of manufacture, the rules of design and the conditions of use: temperature, supply voltage. The time t1 may therefore be used as a signal to activate the reading proper. In the last diagram, VLBn, it is shown that the voltage VLBn on the bit line n that is addressed begins to grow at the instant t1 and reaches its reading level rapidly (in 5 to 10 ns) even before the voltage on the word line m has reached 80% threshold voltage.

Figure 5:
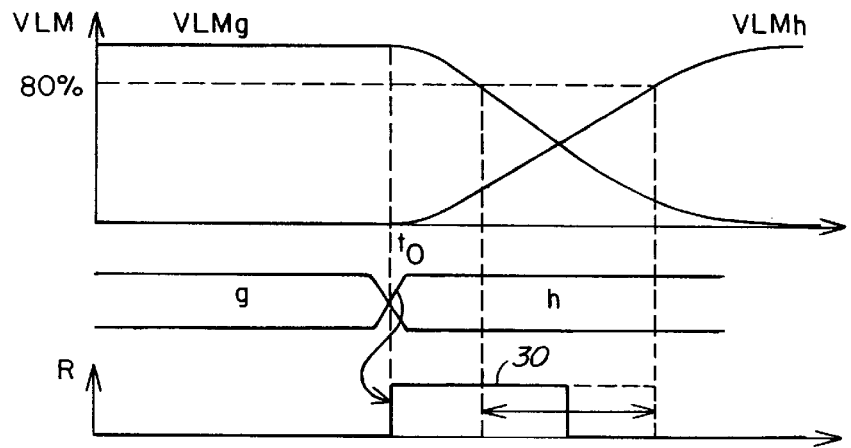
FIG. 5 shows the shape of a signal produced by a circuit providing an improvement according to the invention.

FIG. 5 shows word line g and h switching and what happens for word lines g and h when an address changing signal occurs at the instant t0. The voltage VLMg previously available on the word line g begins to decrease at the instant t0 while the voltage VLMh begins to rise on the word line h. The decrease in VLMg is due to a connection to the ground of an end of the line g. It is important to prevent the reading of the memory so long as the voltage on the word line g has not fallen back beyond 80% of the nominal voltage applied to the word line for the reading (otherwise the line g could be read whereas it is the line h that is to be read). In the invention, this prevention is obtained by creating an inhibition circuit 31 that neutralizes the read circuit 27 for a calibrated duration 30 after each address transition. This duration should be greater than the time during which a 20% decrease in the voltage VLMg occurs. This duration with a 20% decrease is furthermore substantially the same as the duration needed for a growth by 20% of the signal VLMh. Furthermore, the square-wave 30 of the inhibition signal must have a duration smaller than the duration at the end of which the voltage VLMh reaches 80% of the nominal value.

If, in addition, it is desired that the duration T should be about 10 nanoseconds, it is enough that the duration of the square wave 30 should be substantially equal to 50% of the build-up time of the voltage on the word line. The precision required for this duration of inhibition is small. The duration of inhibition must range from 20% to 80% of this build-up time. To be very exact, it must be smaller than the duration 80% - T. However, this duration at 80% and above all the duration T may be modified. For example, it is possible that the pre-charging of the bit lines will not be activated by the time t1. The time t1 may for example be only a confirmation of the validity of the reading. In this case, the duration T may be close to zero. Thus, it is possible without difficulty to be satisfied with an RC type circuit 31, that can be seen in FIG. 3, to produce the square-wave 30. The circuit 31 has a resistor 32 series-connected with a capacitor 33 that is itself parallel-connected with a resetting transistor 34.

When an address transition detection circuit 35 connected to the input of the circuit 31 carries out a detection, it produces two signals. It produces first of all a pulse applied to the control gate of the transistor 34 which has the effect of swiftly discharging the circuit 31. Secondly, it produces a voltage signal (for example VCC) that is maintained for the duration of the presence of the address. The maintained signal is applied to the RC circuit and slowly changes the capacitor 33. The voltage of the midpoint of the RC circuit rises slowly. The midpoint of the circuit 31 is connected to a comparator 36 which also receives the reference signal Ref (or any other equivalent signal). The comparator 36 produces a signal R (FIG. 5) with a square-wave, before it switches over, for the duration 30. This square-wave is applied to an inhibition or resetting input of the read circuit 27. This circuit is inhibited so long as the square-wave is active. The comparator 36 switches over when the midpoint of the circuit 31 has reached sufficient value, i.e. approximately when the voltage on the word line has reached 50% of its nominal value.

Diagram VLMp of FIG. 4 shows the working of the inhibition circuit 31. When the addresses oscillate, as in the case of the addresses k and l, the inhibition signal R remains active and the read circuit 27 cannot fulfil its role. By contrast, after a duration of a square-wave 30, after a time t0, the circuit 27 is in service and the activation signal may be detected at the time t1 by the circuit 27.

FIG. 3 also gives a view, downline to the circuit 27, of a circuit 37 capable of receiving signals other than the activation signal in order to prompt the definitive activation on the connection 21 of the read circuits 18 to 20. In normal operation, these other signals are in the active state before the signal delivered by the circuit 27, so that it may be considered that it is truly this circuit 27 that prompts the reading operation.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A memory comprising:

a plurality of memory cells connected in a matrix form to bit lines and word lines, each of the plurality of memory cells having a floating-gate transistor;

an address decoding circuit for imposing read potentials on at least one bit line and at least one word line corresponding to one of the plurality of memory cells to be selected, and imposing different potentials on the other bit lines and word lines;

read circuits, each read circuit connected to one bit line for measuring a current flowing into one of the plurality of memory cells connected to said one bit line, the read circuits being activated by an activation signal; and an activation circuit producing an activation signal to enable a read operation performed by the read circuits, wherein the activation circuit comprises, an additional bit line having additional memory cells, each additional memory cell being respectively controlled by a word line of the memory, the additional memory cells being in a programming state that prompts passage of a current through all of the additional memory cells when any one of the additional memory cells is selected by the respective word line, an additional read circuit connected to the additional bit line, the additional read circuit producing the activation signal upon connection to the additional bit line, and a circuit for imposing a read potential on the additional bit line at each read operation and for connecting the additional bit line and the additional read circuit when any one of the additional memory cells is selected.

2. A memory according to claim 1, wherein:

each of the additional memory cells comprise floating-gate transistors having a conduction channel implanted with N type impurities allowing the floating-gate transistors of the additional memory cells to conduct when the read potential on any word line has not yet reached a nominal value necessary for the conduction of the transistors of the plurality of memory cells.

3. A memory according to claim 1, wherein:

each of the additional memory cells comprise a floating-gate transistor having a geometry different from that of the floating-gate transistors of the plurality of memory cells, allowing a word line to activate the transistor of the selected additional memory cell before activating the transistor of the selected cell of the plurality of the memory cells.

4. A memory according to claim 1, wherein:

each of the additional memory cells comprise a floating-gate transistor having a concentration of electrical charges stored in their floating gate which is different from that of the floating-gate transistors of the plurality of memory cells.

5. A memory according to claim 1, wherein the activation circuit comprises a disabling circuit for disabling the transmission of the activation signal from the additional read circuit.

6. A memory according to claim 5, wherein the disabling circuit produces a disabling signal whose duration ranges from 20% to 80% of the build-up time of the word line voltage.

7. A memory according to claim 5, wherein the disabling circuit comprises an RC circuit.

8. A memory according to claim 1, wherein:
each additional memory cell comprises a floating-gate transistor;
a control gate of each floating-gate transistor is controlled by a word line, and
a bit line is connected to one of (i) a drain and (ii) a source region of each floating-gate transistor.

9. A memory according to claim 1, wherein:
a control gate of a floating-gate transistor of at least one cell is controlled by a word line, and
a bit line is connected to one of a drain or a source region of one of (i) a floating-gate transistor and (ii) a floating gate transistor of said cell.

10. A memory as in claim 1, wherein each additional memory cell comprises a floating-gate transistor.

11. A memory as in claim 1, wherein each additional memory cell comprises a transistor having a threshold voltage lower than the threshold voltage of the transistor of each of the plurality of memory cells.

12. A memory as in claim 1, wherein each additional memory cell comprises a transistor which conducts at predetermined period before the selected transistor of the memory cell conducts, the predetermined period being determined by one of (i) a level of depletion of a conduction channel of the transistor of the additional memory cell; (ii) channel width of the transistor of the additional memory cells relative to the plurality of memory cells; (iii) a ratio of an inter-gate capacitance to a capacitance between a floating gate and a conduction channel of the transistor of the additional memory cell; and (iv) difference in programming levels of the transistor of the additional memory cells and the transistors of the plurality of memory cells.

13. A memory as in claim 1, wherein each additional memory cell comprises a transistor which conducts at predetermined period before the selected transistor of the plurality of memory cell conducts, the predetermined period being independent of method of manufacturing, rules of design, temperature and supply voltage.

14. A memory as in claim 5, wherein the disabling circuit comprises:
an address transition detection circuit outputting after each address transition, a voltage signal for the duration of an address presence and an address transition detection signal;
an RC circuit coupled to the address transition detection circuit, the RC circuit having a transistor in parallel with a capacitor and in series with a resistor, a gate of the transistor in parallel with the capacitor receiving the address transition signal and the resistor receiving the voltage signal, the RC circuit generating a rising signal upon receipt of the address detection signal and the voltage signal; and
a comparator receiving the rising signal and issuing a disabling signal when the rising signal equals to a threshold signal.

15. A memory comprising:
a plurality of memory cells connected in a matrix form to bit lines and word lines;
an address decoding circuit for imposing read potentials on at least one bit line and at least one word line corresponding to one of the plurality of memory cells to be selected;
a read circuit connected to each of the bit lines for measuring a current flowing into the corresponding one of the plurality of memory cells connected to said bit line, the read circuit being activated by an activation signal; and
read circuit activation means for issuing the activation signal to the read circuit when a voltage on a word line corresponding to the selected one of the plurality of memory cells reaches a predetermined voltage level lower than a voltage level necessary for reading the selected memory cell.

16. A memory as in claim 15, further comprising disabling means for inhibiting the read circuit from receiving the activation signal from the activation means for a preselected duration after each address transition, the preselected duration being smaller than 80% of the build up time of said word line voltage minus a period T defined as a period between the time the predetermined voltage level is reached and the time said selected cell of the plurality of memory cells is read.

17. A memory as in claim 15, wherein the disabling means comprises:
an address transition detection circuit for outputting an address transition detection signal following each address transition; and
a circuit for generating an inhibition signal for inputting an inhibition signal to the read circuit activation means in response to the address detection signal.

18. A method of reading a memory having a plurality of memory cells connected in a matrix form to bit and word lines, the bit lines being connected to read circuits, and additional memory cells forming an additional bit line, each additional memory cell being controlled by a word line, the method comprising steps of:
selecting a bit line corresponding to a selected one of the plurality of memory cells and building-up a voltage on the selected bit line;
selecting a word line corresponding to the selected one of the plurality of memory cell and building-up a first threshold voltage on the selected word line for a period t;
activating a corresponding one of the additional memory cells connected to the selected word line after a second threshold voltage smaller than the first threshold voltage is reached on the word line;
activating the read circuits when one of the additional memory cells is activated; and
reading selected cell of the plurality of memory cells when the first threshold voltage is reached.

19. A method according to claim 18, further comprising a step of deactivating the read circuits between selection of one cell from the plurality of memory cells.

* * * * *